United States Patent
Hazelton (10) Patent No.: US 7,288,859 B2
(45) Date of Patent: Oct. 30, 2007

(54) WAFER STAGE OPERABLE IN A VACUUM ENVIRONMENT

(75) Inventor: Andrew J. Hazelton, San Carlos, CA (US)

(73) Assignee: Nikon Corporation (JP)

(*) Notice: Subject to any disclaimer, the term of this patent is extended or adjusted under 35 U.S.C. 154(b) by 174 days.

(21) Appl. No.: 10/769,668

(22) Filed: Jan. 30, 2004

(65) Prior Publication Data

US 2005/0168076 A1    Aug. 4, 2005

(51) Int. Cl.
    *H02K 41/00* (2006.01)
(52) U.S. Cl. .......................... 310/12; 355/72
(58) Field of Classification Search ................. 310/12; 355/53, 72; 74/490.08; 33/1 M
    See application file for complete search history.

(56) References Cited

U.S. PATENT DOCUMENTS

| | | | | |
|---|---|---|---|---|
| 6,069,416 A * | 5/2000 | Chitayat | ...................... | 310/12 |
| 6,353,271 B1 * | 3/2002 | Williams | ...................... | 310/12 |
| 6,437,351 B1 * | 8/2002 | Smick et al. | .......... | 250/492.21 |
| 6,499,880 B2 | 12/2002 | Tsuda et al. | .................... | 384/9 |
| 6,597,435 B2 * | 7/2003 | Poon et al. | .................... | 355/75 |
| 6,917,046 B2 * | 7/2005 | Korenaga | ................. | 250/492.2 |
| 6,925,355 B2 * | 8/2005 | Mori et al. | .................. | 700/213 |
| 2004/0020438 A1 * | 2/2004 | Rechav et al. | | |
| 2005/0061626 A1 * | 3/2005 | Hol et al. | | |

OTHER PUBLICATIONS

Hazelton, Andrew J. et al., "Stage Assembly Including a Reaction Mass Assembly" U.S. Appl. No. 09/714,747, filed Nov. 16, 2000.
Hazelton, Andrew J., "Reaction Frame Apparatus and Method" U.S. Appl. No. 10/151,589, filed May 16, 2002.
Hazelton, Andrew J. et al., "Wafer Stage With Magnetic Bearings" U.S. Appl. No. 10/272,930, filed Oct. 18, 2002.

* cited by examiner

*Primary Examiner*—Dang Le
(74) *Attorney, Agent, or Firm*—Aka Chan LLP (57) ABSTRACT

Methods and apparatus for enabling a stage apparatus to scan an object within a vacuum environment associated with an extreme ultraviolet lithography system are disclosed. According to one aspect of the present invention, a stage apparatus that is suitable for operation in a vacuum environment includes a coarse stage assembly that include a coarse stage and at least one air bearing that is vacuum-compatible. The stage apparatus also includes a fine stage assembly which has a fine stage that is arranged substantially adjacent to the coarse stage. The fine stage is arranged to be positioned relative to the coarse stage using electromagnetic energy.

14 Claims, 7 Drawing Sheets

WAFER STAGE OPERABLE IN A VACUUM ENVIRONMENT

BACKGROUND OF THE INVENTION

1. Field of Invention

The present invention relates generally to semiconductor processing equipment. More particularly, the present invention relates to a stage assembly which is suitable for use in a vacuum environment such as a vacuum environment associated with an extreme ultraviolet lithography system.

2. Description of the Related Art

For precision instruments such as photolithography machines which are used in semiconductor processing, factors which affect the performance, e.g., accuracy, of the precision instrument generally must be dealt with and, insofar as possible, eliminated. When the performance of a precision instrument is adversely affected, as for example by contamination, products formed using the precision instrument may be improperly formed and, hence, function improperly. For example, if a photolithography machine which is not designed to operate in a vacuum is used in a vacuum environment, the photolithography machine may cause the vacuum environment to be contaminated. As a result, the vacuum level associated with the environment may be compromised, thereby affecting an overall photolithography process which utilizes the photolithography machine.

Lithography processes, e.g., photolithography processes, are integral to the fabrication of wafers and, hence, semiconductor chips. Systems used for lithography include optical lithography systems, electron beam projection systems, and extreme ultraviolet (EUV) lithography systems. The development of EUV lithography systems is becoming more widespread, as the capabilities of EUV lithography systems generally exceed those of conventional optical lithography systems and electron beam projection systems.

In an EUV lithography system, beams of extreme ultraviolet (EUV) light are reflected off of a reflective reticle, which contains a circuit pattern, onto a semiconductor wafer. Reticle scanning stages are generally used to position a reticle over a wafer such that portions of the wafer may be exposed as appropriate for masking or etching. Patterns are generally resident on the reticle, which effectively serves as a mask or a negative for the wafer. When a reticle is positioned with respect to a wafer as desired, a beam of EUV light may be reflected off of the reticle on which a thin metal pattern is placed and effectively focused onto the wafer.

Many scanning stage devices include a coarse stage and a fine stage which cooperate to position an object such as a reticle or a wafer. Specifically, many high precision machines used in semiconductor fabrication use a coarse stage for relatively large motion and a fine stage for smaller, or more precise, motion. A coarse stage is used to coarsely position a wafer, for example, near a desired position, while a fine stage is used to finely tune the position of the wafer once the wafer is positioned near its desired position by the coarse stage.

In general, an EUV lithography system must operate in a relatively high vacuum environment, which may be expensive to maintain, as any gas leakage into the vacuum environment must be corrected in order to prevent the vacuum level from being significantly compromised. Gas leakage may be associated with air bearings used in many standard EUV lithography systems. Maintaining the vacuum level in a vacuum environment such as a chamber to compensate for gas leakage and other contamination is often difficult or impractical.

As is the case with many scanning stages, the scanning stages used in an EUV lithography system are typically moved using motors such as linear motors. When it is necessary to service the motors, since the motors are positioned within a vacuum chamber, the vacuum chamber is generally opened to enable the motors to be accessed. Opening and closing, i.e., unsealing and resealing, the vacuum chamber is often a tedious process. The accessing of motors within a vacuum chamber exposes the vacuum chamber to contaminants and moisture, which may contaminate the surfaces of components within the vacuum chamber. The moisture within the vacuum chamber generally must be removed before the vacuum chamber may be used again, which increases the time associated with an overall pump down process used to create a vacuum within the vacuum chamber once the vacuum chamber is resealed.

Within a vacuum chamber, it is difficult to maintain an acceptable operational temperature, as motors used to move scanning stages, as for example fine scanning stages, often heat up during operation. When the temperature within the vacuum chamber is too high, the operation of sensors within the vacuum chamber may be compromised. Since there is no air available in the vacuum chamber during an EUV lithography process, the only cooling that is available within the vacuum chamber results from conduction and radiation. As such, maintaining an acceptable temperature within the vacuum chamber is often a difficult process.

Maintaining an acceptable vacuum level and an acceptable temperature within a vacuum chamber is important in order to ensure a high level of performance for an EUV lithography process. Specifically, the ability to efficiently and relatively easily maintain a desired vacuum level and a desired temperature is important.

Therefore, what is needed is a method and an apparatus for providing a relatively easy to maintain EUV lithography system. That is, what is desired is an EUV lithography system which includes a wafer stage device that enables both a desired vacuum level and a desired temperature to be accurately and efficiently maintained.

SUMMARY OF THE INVENTION

The present invention relates to a stage apparatus which scans an object in a vacuum environment associated with an extreme ultraviolet lithography system. According to one aspect of the present invention, a stage apparatus that is suitable for operation in a vacuum environment includes a coarse stage assembly that include a coarse stage and at least one air bearing that is vacuum-compatible. The stage apparatus also includes a fine stage assembly which has a fine stage that is arranged substantially adjacent to the coarse stage. The fine stage is arranged to be positioned relative to the coarse stage using electromagnetic energy.

In one embodiment, the fine stage is arranged to move in up to six degrees of freedom, and may effectively be suspended over the coarse stage by a bellows or by at least one magnet. In another embodiment, the coarse stage may be arranged to move in up to two or three degrees of freedom.

A stage apparatus which includes vacuum-compatible bearings, e.g., vacuum-compatible air bearings, enables the stage apparatus to be used in a vacuum environment without a significant risk of the vacuum environment being contaminated due to leakage from the air bearings. The use of a substantially levitating fine stage as a part of such a stage apparatus further enables an object such as a wafer to be accurately scanned.

According to another aspect of the present invention, a stage apparatus includes a first stage assembly and a second stage assembly. The first stage assembly includes a first stage, at least one vacuum-compatible bearing, and an actuator. The vacuum-compatible bearing and the actuator enable the first stage assembly to move, and the vacuum-compatible bearing includes at least one pumpout groove arranged to carry a vacuum. The second stage assembly supports an object to be scanned, and is substantially carried on the first stage assembly. The second stage assembly is supported in six degrees of freedom over the first stage assembly by at least one electromagnetic actuator.

In one embodiment, vacuum-compatible bearing has a first groove that carries the vacuum, a second groove that carries pressurized air, and a third groove that carries a gas at a relatively low pressure that is arranged to not absorb radiation of approximately 13 nanometers. In such an embodiment, the low pressure may be a pressure of up to approximately one milliTorr, and the gas may be helium, argon, neon, or krypton.

According to still another aspect of the present invention, a stage apparatus suitable for operation in a vacuum environment includes a first stage assembly which has a first stage, at least one vacuum-compatible bearing, and an actuator. The vacuum-compatible bearing and the actuator enable the first stage assembly to move, and the vacuum-compatible bearing includes at least one pumpout groove arranged to carry a vacuum. The stage apparatus also includes a second stage assembly which has a second stage and a plurality of electromagnetic actuators arranged to provide the second stage with up to six degrees of freedom. The second stage assembly supports an object to be scanned, and is substantially carried on the first stage assembly such that the second stage assembly is arranged to move with the first stage assembly when the first stage assembly moves. The second stage assembly is substantially supported over the first stage assembly by at least one air bellows.

In one embodiment, the first stage is a coarse stage arranged to move with up to three degrees of freedom. In such an embodiment, the first stage assembly may include a guide bar assembly, wherein the coarse stage includes magnets and the guide bar assembly includes coils. The magnets and the coils cooperate to enable the coarse stage to move with up to the three degrees of freedom.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

The performance of extreme ultraviolet (EUV) lithography system is often compromised when an acceptable vacuum level or an acceptable temperature within a vacuum chamber may not be maintained. Hence, the ability to efficiently and relatively easily maintain a desired vacuum level and to maintain a desired temperature in a vacuum environment associated with an EUV lithography system is critical.

A stage arrangement which is arranged to be used in a vacuum system may include vacuum-compatible air bearings which generally leak a relatively insignificant amount of gas, a guideless coarse stage assembly, and a substantially levitating fine stage assembly. The use of vacuum-compatible air bearings generally reduces the likelihood that a vacuum system is contaminated, as air or pressurized air is less likely to leak from such air bearings into the surrounding vacuum environment. In one embodiment, substantially all air bearings in the stage arrangement are vacuum-compatible. The use of a guideless coarse stage assembly and a substantially levitating fine stage allows an object, e.g., a wafer, supported on the fine stage to be accurately scanned with a relatively low amount of force and, in addition, is vacuum-compatible.

Figure 1A:
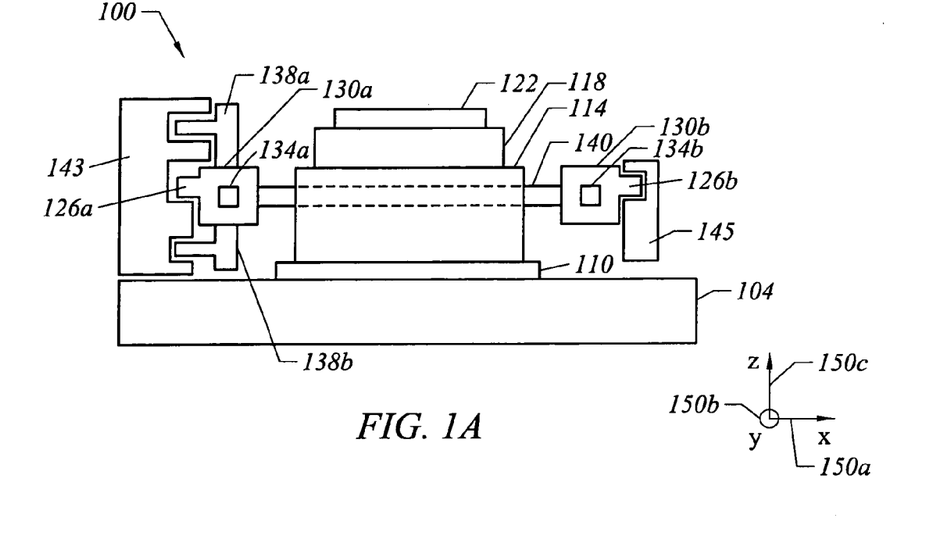
FIG. 1a is a block diagram representation of a side-view of a wafer stage arrangement that is operable in a vacuum in accordance with an embodiment of the present invention.
Figure 1B:
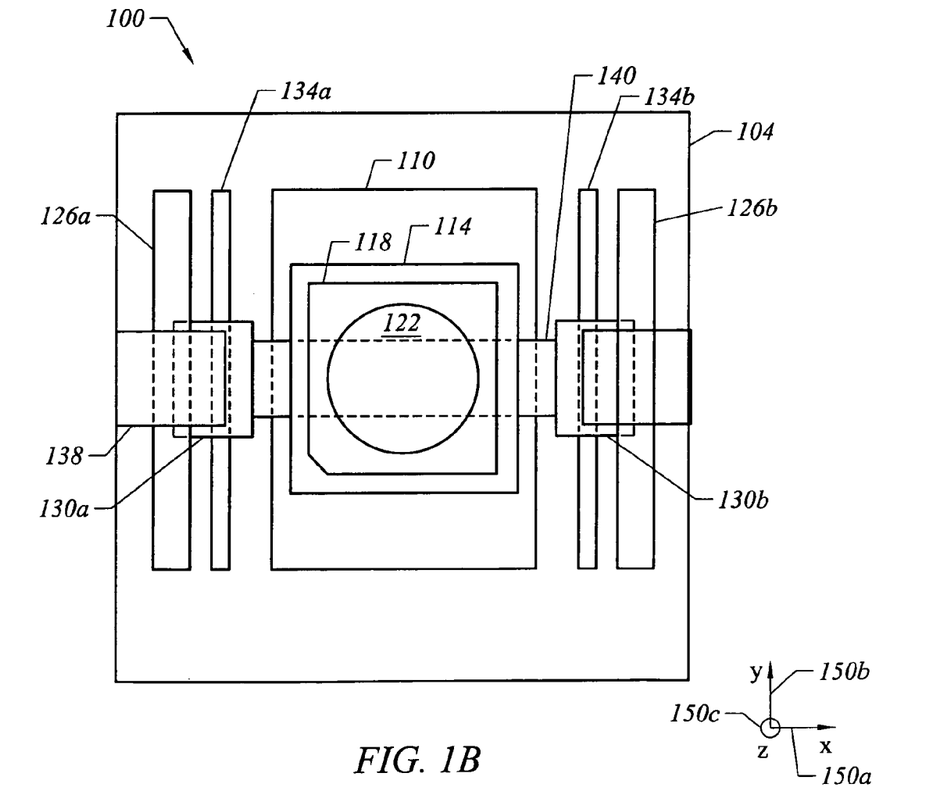
FIG. 1b is a block diagram representation of a top view of a wafer stage arrangement, i.e., wafer stage arrangement 100 of FIG. 1a, in accordance with an embodiment of the present invention.

FIG. 1a is a block diagram representation of a side-view of a wafer stage arrangement that is operable in a vacuum, and FIG. 1b is a block diagram representation of a top view of the wafer stage arrangement in accordance with an embodiment of the present invention. A wafer stage arrangement 100 includes a coarse stage 114 and a fine stage 118 on which an object, e.g., a wafer 122, is supported. Fine stage 118 is effectively carried on coarse stage 114 such that fine stage 118 essentially moves with coarse stage 114. Coarse stage 114 has an air bearing foot (not shown) which is on a bottom surface of coarse stage 114 and substantially interfaces with an air bearing surface 110 which is positioned atop a base plate 104, or a jouban. Coarse stage 114 moves over air bearing surface 110 with up to three degrees of freedom as coarse stage 114 moves substantially along a guide bar assembly 140 which, as will be discussed below with respect to FIGS. 4a and 4b, may either be a guide bar assembly of a plurality of motor stators or a ceramic shaft with an air bearing. The three degrees of freedom which may be associated with coarse stage 114 are translational freedom along an x-axis 150a and a y-axis 150b, and rotational freedom about a z-axis 150c. In general, up to three actuators may be used to enable coarse stage 114 to move with up to three degrees of freedom.

Guide bar assembly 140 is coupled between vacuum-compatible air bearings 130 which are arranged to constrain the motion of guide bar assembly 140. In one embodiment, vacuum-compatible air bearings 130 allow guide bar assembly 140 to move substantially only with a single degree of freedom, e.g., along y-axis 150b, using guide bars 134. Vacuum-compatible air bearings are generally air bearings which have vacuum pumpout grooves, as will be discussed below with respect to FIG. 2. Motors 126, which may be linear motors, are coupled to air bearings 130 and effectively drive guide bar assembly 140.

A moving reaction canceller 138 is coupled to air bearing 130a. Moving reaction canceller 138 generally includes a motor (not shown) which transmits a reaction force on guide bar assembly 140 in a direction along x-axis 150a to a reaction frame 143 or a counter mass. Similarly, motors 126 transmit reaction forces on guide bar assembly 140 in a direction along y-axis 150b and about z-axis 150c to reaction frame 143 and a reaction frame 145.

Reaction frames 143, 145, or reaction or counter masses, may generally reduce vibrations within wafer stage arrangement 100. Substantially any reaction frame 143, as for example those described in co-pending U.S. patent application Ser. No. 10/151,589, filed May 16, 2002, and Ser. No. 09/932,410, filed Aug. 17, 2001, which are each incorporated herein by reference in their entireties, or substantially any counter mass, as for example as described in co-pending U.S. patent application Ser. No. 09/714,747, filed Nov. 16, 2000, which is incorporated herein by reference in its entirety, may be used as a part of wafer stage arrangement 100.

Air bearing surface 110 and base plate 104 are essentially flat surfaces. When air bearing surface 110 and base plate 104 are used in a vacuum system, air bearing surface 110 and base plate 104 are typically formed from a non-porous material such that absorption of pressurized air from an air bearing foot (not shown) at a bottom of coarse stage 114 and subsequent outgassing is substantially minimized.

Fine stage 118 may be a magnetic levitating fine stage, as described in co-pending U.S. patent application Ser. No. 10/272,930, filed Oct. 18, 2002, which is incorporated herein by reference in its entirety, or substantially any fine stage which has a relatively low stiffness coupling to an associated coarse stage. The use of either a magnetic levitating fine stage which is supported and positioned by electromagnetic actuators or a stage that is supported on an air bellows allows the weight associated with fine stage 118 to be substantially supported without requiring a relatively large amount of energy or current, and also allows fine stage 118 to be accurately positioned. In one embodiment, fine stage 118 may be supported in up to six degrees of freedom by electromagnetic actuators, and also partially supported by pressurized air, as described in co-pending U.S. patent application Ser. No. 10/272,930.

Figure 5A:
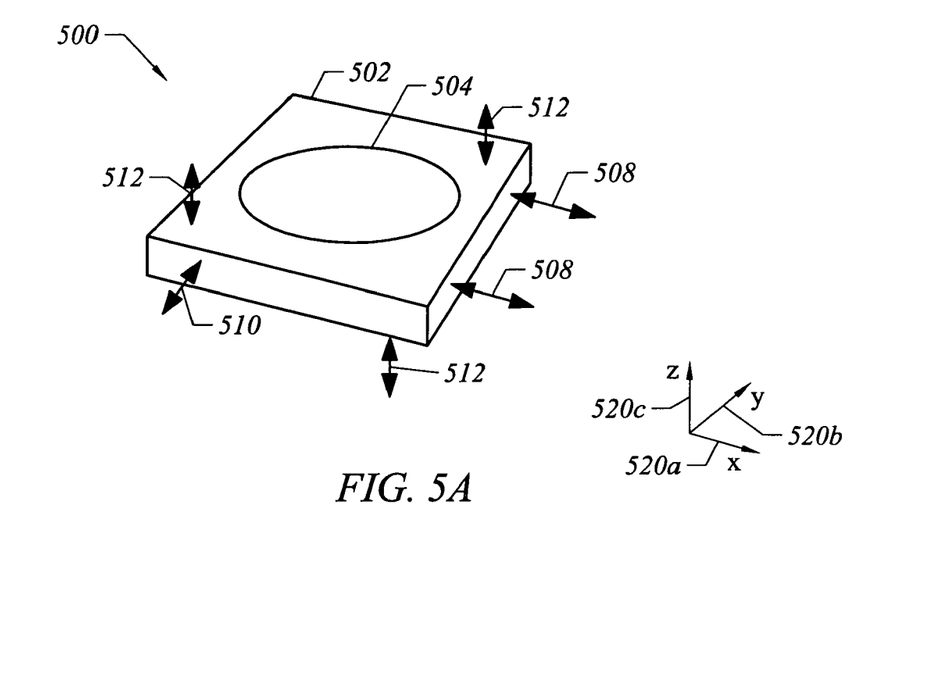
FIG. 5a is a diagrammatic representation of a fine stage assembly in accordance with an embodiment of the present invention.

One example of a fine stage with six degrees of freedom will be discussed below with respect to FIG. 5a. In general, fine stage 118 has a wafer holder (not shown) on which wafer 122 is located, actuators (not shown) for controlling the position of fine stage 118 in six degrees of freedom, and interferometer mirrors (not shown). Since fine stage 118 is typically positioned and supported using electromagnetic actuators, pressurized air in an air bellows, or pressurized air in a substantially leak-free gas cylinder, fine stage 118 is suitable for use in a vacuum environment. Fine stage 118 is particularly suitable for use in a vacuum environment since fine stage 118 is positioned and supported by a system which generally does not leak air or gas.

Figure 2:
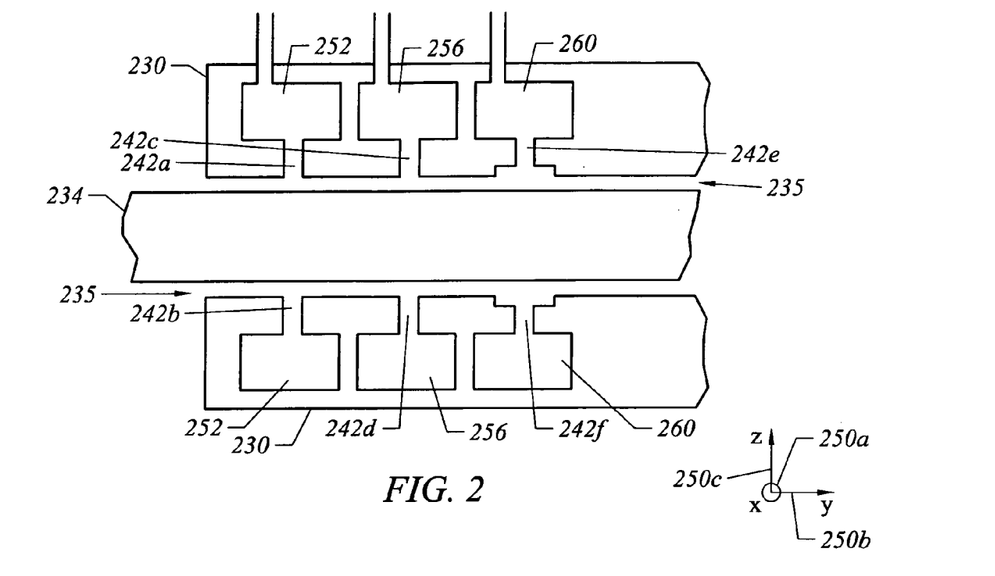
FIG. 2 is a diagrammatic cross-sectional representation of a vacuum-compatible air bearing in accordance with an embodiment of the present invention.

Air bearings 130 are vacuum-compatible since, as mentioned above, air bearings 130 have vacuum pumpout grooves which may reduce the leakage of pressurized air into a surrounding vacuum environment. With reference to FIG. 2, the grooves included in a vacuum-compatible air bearing such as air bearing 130a or air bearing 130b will be described in accordance with an embodiment of the present invention. A vacuum-compatible air bearing 230 is arranged as a slider around a guide bar or shaft 234 such that air bearing 230 may effectively slide along a y-axis 250b on a cushion of air. In other words, air bearing 230 slides about guide bar 234 separated by a gap 235. Air bearing 230 includes grooves 242 which may be coupled to vacuum supplies, atmospheric air supplies, and pressurized air supplies. It should be appreciated that such supplies are typically external to air bearing 230, and are in communication with areas 252, 256, 260. Grooves 242a, 242b are coupled to a vacuum area 252 which provides a vacuum supplied by an external vacuum supply through grooves 242a, 242b, while grooves 242c, 242d may be coupled to a relatively low pressure area 256 which is in communication with an external supply of air at approximately atmospheric pressure or an external vacuum supply. Grooves 242e, 242f are generally coupled to a pressurized air area 260 which receives pressurized air from an external air supply. By properly adjusting the pressures in areas 252, 256, 260, air bearing 230 may slide substantially frictionlessly along guide bar 234 relative to y-axis 250b, and not leak any appreciable air into the external vacuum around air bearing 230.

Grooves 242 are generally arranged such that grooves 242a, 242b which are the outermost grooves 242 on air bearing 230 are coupled to vacuum supply 252. Hence, if there is any leakage of air, gas, or vacuum associated with air bearing 230, the leakage is typically of vacuum from outermost grooves 242a, 242b. Since vacuum leaking from grooves 242a, 242b is leaked into a surrounding vacuum environment, the leaked vacuum generally does not have a significant adverse affect on the vacuum environment.

Within an EUV lithography system, some partial pressure may be tolerated. In other words, it may be possible for an EUV lithography system to operate in an environment with a partial pressure, as for example a pressure of up to approximately 10 to 100 milliTorr (mTorr). As such, it may be possible to use gases in lieu of air in air bearing 230. The use of gases which do not absorb some wavelengths of radiation, e.g., approximately thirteen nanometers (nm) of radiation, may be particularly suitable in an EUV lithography system, both as gases in air bearing 230 and as gases in the surrounding environment. Suitable gases include, but are not limited to helium, argon, neon, and krypton. It should be appreciated that a vacuum-compatible air bearing which uses a gas such as helium, argon, neon, or krypton may generally be considered to be a vacuum-compatible gas bearing.

Figure 3:
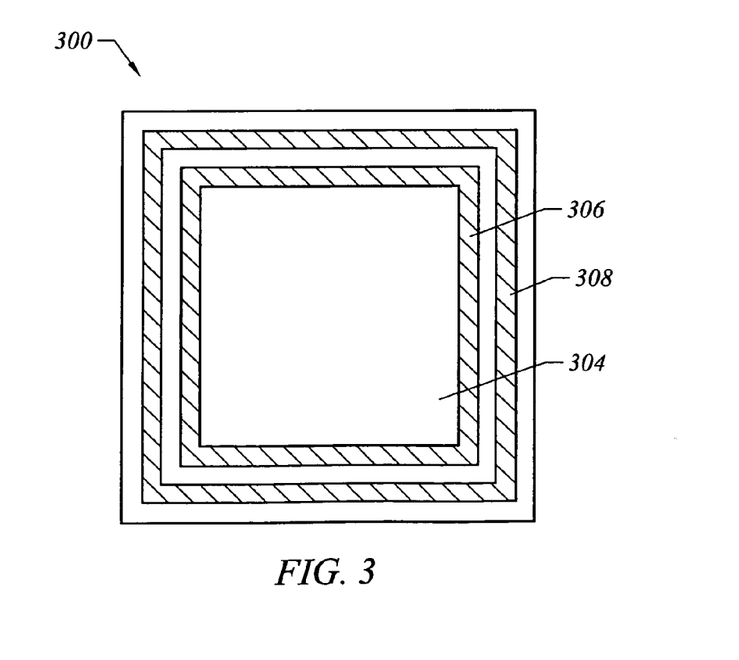
FIG. 3 is a diagrammatic representation of a vacuum-compatible air bearing foot in accordance with an embodiment of the present invention.

As previously mentioned, a bottom surface of a coarse stage such as coarse stage 114 of FIGS. 1a and 1b is an air bearing foot. FIG. 3 is a diagrammatic representation of a vacuum-compatible air bearing foot in accordance with an embodiment of the present invention. An air bearing foot 300 includes at least one relatively flat pad 304 which may include a plurality of air pads (not shown). Pad 304 is surrounded by pumpout grooves 306, 308 which are substantially concentrically located around the perimeter of pad 304. Pumpout grooves 306, 308 are arranged to substantially prevent air or gas, e.g., air or gas supplied to pad 304, from leaking into the vacuum environment which surrounds an overall stage arrangement which includes air bearing foot 300, while allowing pad 304 to operate as if it were in a non-vacuum environment. In one embodiment, pumpout grooves 306, 308 may be configured similarly to grooves 242a, 242b and grooves 242c, 242d of FIG. 2.

Figure 4A:
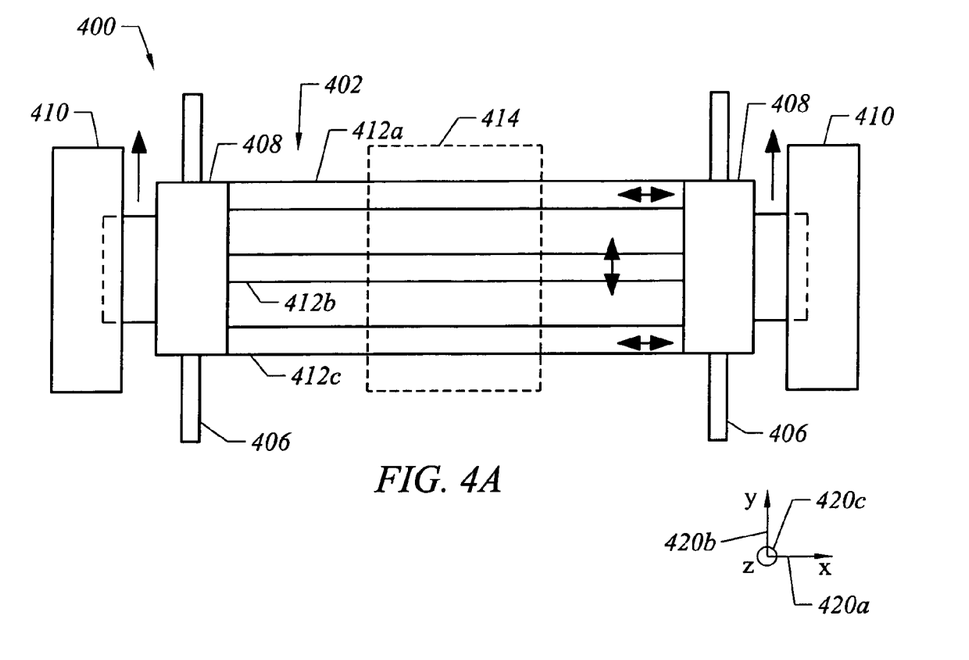
FIG. 4a is a diagrammatic top-view representation of a first coarse stage assembly in accordance with an embodiment of the present invention.

The configuration of a coarse stage assembly that is a part of a wafer stage arrangement which is operable in a vacuum may vary widely. FIG. 4a is a diagrammatic top-view representation of a first coarse stage assembly in accordance with an embodiment of the present invention. A guideless coarse stage assembly 400 includes a guide bar assembly 402, vacuum-compatible air bearings 408, and actuators 410. Guide bar assembly 402 is coupled to air bearings 408 such that when air bearings 408 are driven by motors 410 to slide with respect to guide bars 406 along a y-axis 420b, guide bar assembly 402 is moved along y-axis 420b. Air bearings 408 have a single degree of freedom along y-axis 420b, and have five degrees of freedom constrained. Reaction forces which are generated by the movement of guide bar assembly 402 along y-axis 420b are substantially absorbed by magnets which are a part of motors 410 or, alternatively, by a reaction frame or a counter mass (not shown).

Guide bar assembly 402 includes three coils 412 which, in conjunction with a coarse stage 414 that includes three magnets or magnet tracks, operate to drive coarse stage 414 in up to three degrees of freedom. Coils 412 may be driven to move coarse stage 414 along y-axis 420b and along an x-axis 420a. It should be appreciated that reaction forces associated with movement along y-axis 420b may be absorbed by motors 410, while x-axis 420a may be substantially absorbed by guide bars 406. Alternatively, reaction frames or counter masses (not shown) may be included in coarse stage assembly 400 to absorb various reaction forces. When coils 412a and coils 412b are driven substantially together in opposite directions with respect to x-axis 420c, coarse stage 414 may be provided with rotational motion about a z-axis 420c, i.e., coarse stage 414 may effectively undergo a yawing motion.

Figure 4B:
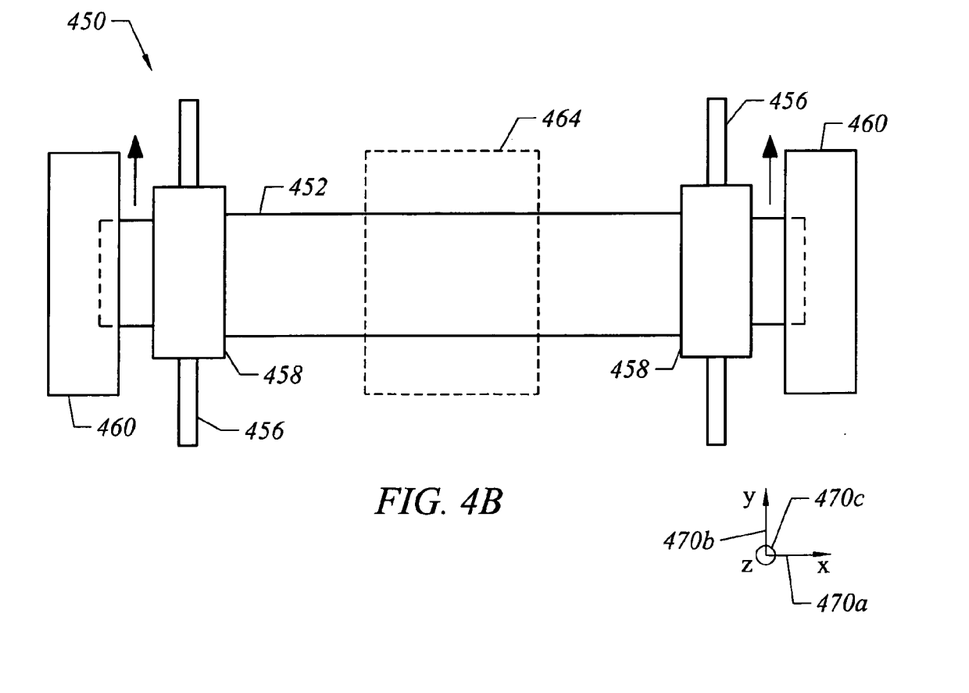
FIG. 4b is a diagrammatic top-view representation of a first coarse stage assembly in accordance with an embodiment of the present invention.

With reference to FIG. 4b, a second coarse stage assembly will be described in accordance with an embodiment of the present invention. A guideless coarse stage assembly 450 includes a guide bar assembly 452 that is coupled to vacuum-compatible air bearings 458 which slide over guide bars 456. Air bearings 458 each have one degree of freedom, and have five constrained degrees of freedom, i.e., air bearings 458 may translate with respect to a y-axis 470b and are substantially prevented from any other significant translation or rotation. Motors 460, which are coupled to air bearings 458, are arranged to drive air bearings 458 and, hence, guide bar assembly 452 along y-axis 470b.

As shown, guide bar assembly 452 is formed from a single shaft and, cooperates with an air bearing, e.g., a vacuum-compatible air bearing, that is a part of a coarse stage 464 to allow coarse stage 464 to translate substantially only with respect to an x-axis 470a. That is, coarse stage 464 may include an air bearing which provides a single degree of freedom. Alternatively, however, guide bar assembly 452 may be arranged to allow two degrees of freedom, as for example yaw about a z-axis 470c and translation about one axis 470, while a foot on coarse stage 464 may constrain three degrees of freedom, such that coarse stage 464 itself has substantially two degrees of freedom, and may be moved along with guide bar assembly 452 using air bearings 458 along a y-axis 470b.

Like a coarse stage assembly, a fine stage assembly that is a part of a wafer stage assembly which is suitable for use in a vacuum system may have a variety of different suitable configurations. As previously mentioned, suitable fine stage assemblies may include, but are not limited to, a magnetic levitating fine stage assembly and a fine stage assembly which includes an air bellows. FIG. 5a is a diagrammatic representation of a fine stage assembly in accordance with an embodiment of the present invention. A fine stage assembly 500 includes a fine stage 502 which supports an object 504 in an object holder (not shown). In the described embodiment, object 504 is a wafer, although object may instead be a reticle. Fine stage 502 is effectively a monolithic wafer table, and has up to six degrees of freedom. When fine stage assembly 500 is a magnetic levitating fine stage assembly, then fine stage 502 is a magnetic levitating fine stage.

Fine stage 502 is generally coupled to at least six electromagnetic actuators, as represented at 508, 510, 512. Actuators 508, 510, 512 are used to allow fine stage 502 to move while the weight of fine stage 502 effectively levitates using magnetic forces, as for example those provided by electromagnetic bearings, or is supported with pressurized air. Two actuators 508 enable translational motion relative to an x-axis 520a, while actuator 510 enables translational motion relative to a y-axis 520b. Three actuators 512a enable translational motion relative to a z-axis 520c. Rotational motion about axes 520 may be achieved by driving actuators 508, 510, 512 differentially or in opposite directions. By way of example, driving actuators 508 in opposite directions with respect to x-axis 520a generally provides a rotational motion or yaw about z-axis 520c.

Figure 5B:
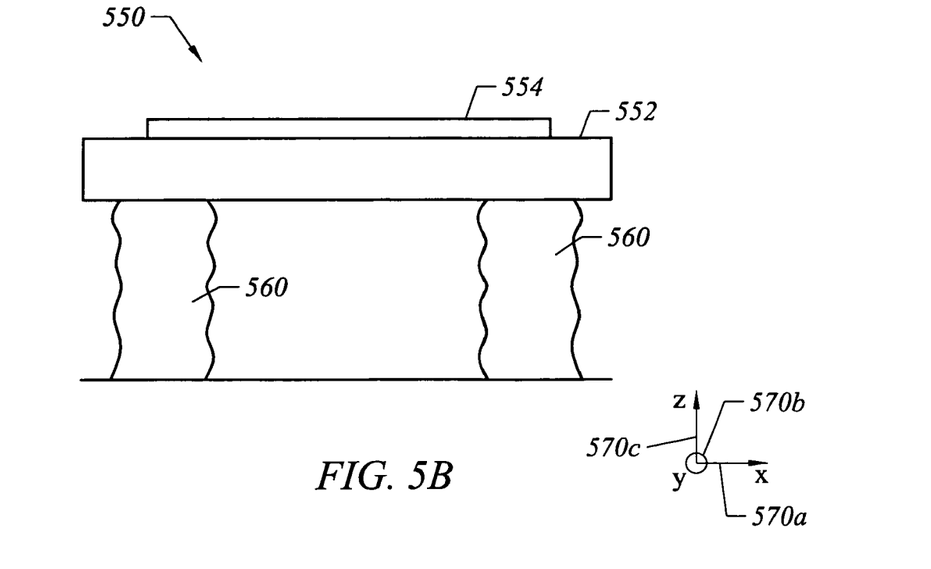
FIG. 5b is a diagrammatic representation of a fine stage arrangement which includes a plurality of air bellows in accordance with an embodiment of the present invention.

In lieu of using a magnetic levitating fine stage, such as the magnetic levitating fine stage that is supported by electromagnetic bearings described in co-pending U.S. patent application Ser. No. 10/272,930, a fine stage that is supported by an air bellows may be used as a part of a vacuum-compatible wafer stage arrangement. That is, instead of having its weight supported through magnetic levitation, the weight of a fine stage may instead be supported on an air cushion. A fine stage that is supported by an air bellows arrangement generally uses less energy to operate than a magnetic levitating fine stage, while still allowing an object supported on the fine stage to be accurately scanned. FIG. 5b is a diagrammatic representation of a fine stage arrangement which includes a plurality of air bellows in accordance with an embodiment of the present invention. A fine stage arrangement 550 includes a fine stage 552 which supports an object 554, e.g., a wafer. Fine stage 552 is supported on air bellows 560 such that air contained within air bellows 560 effectively supports the weight of fine stage 552. A plurality of actuators (not shown), arranged in a configuration similar to the configuration described above with respect to FIG. 5a, allows fine stage 552 to have up to six degrees of freedom. As previously discussed, actuators may include three actuators arranged to provide translational movement with respect to a z-axis 570c, two actuators arranged to provide translational movement with respect to an x-axis 570a, and one actuator arranged to provide translational movement with respect to a y-axis 570b.

Figure 6:
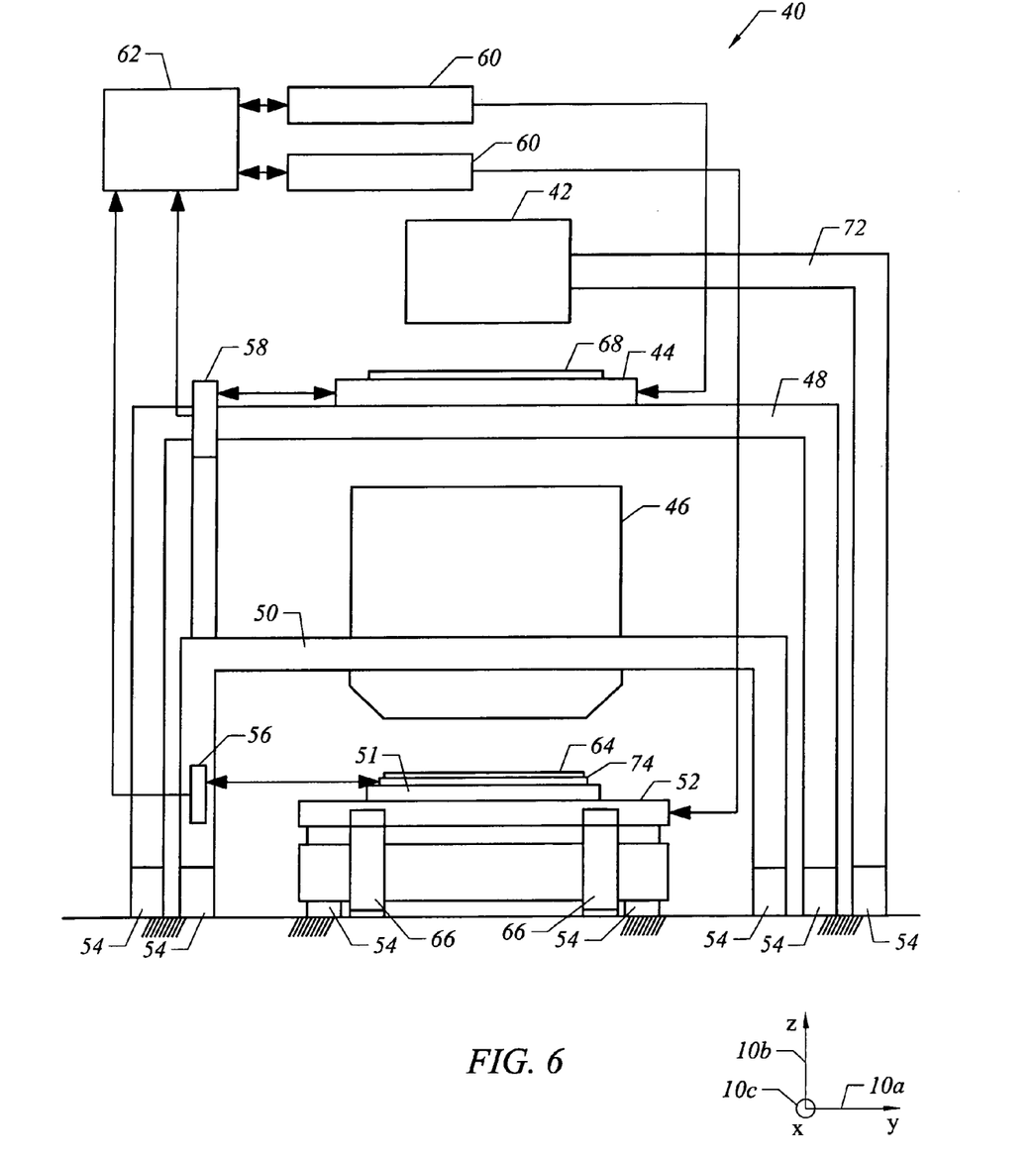
FIG. 6 is a diagrammatic representation of a photolithography apparatus in accordance with an embodiment of the present invention.

With reference to FIG. 6, a photolithography apparatus which may include a vacuum-compatible wafer stage arrangement will be described in accordance with an embodiment of the present invention. It should be appreciated that although a vacuum-compatible wafer stage arrangement has been described as being suitable for use as a part of an EUV lithography system, such a stage may generally be used as a part of substantially any suitable photolithography apparatus. A photolithography apparatus (exposure apparatus) 40 includes a wafer positioning stage 52 that may be driven by a planar motor (not shown), as well as a wafer table 51 that is magnetically coupled to wafer positioning stage 52 by utilizing an EI-core actuator, e.g., an EI-core actuator with a top coil and a bottom coil which are substantially independently controlled. The planar motor which drives wafer positioning stage 52 generally uses an electromagnetic force generated by magnets and corresponding armature coils arranged in two dimensions. A wafer 64 is held in place on a wafer holder or chuck 74 which is coupled to wafer table 51. Wafer positioning stage 52 is arranged to move in multiple degrees of freedom, e.g., in up to six degrees of freedom, under the control of a control unit 60 and a system controller 62. In one embodiment, wafer positioning stage 52 may include a plurality of actuators and have a configuration as described above. The movement of wafer positioning stage 52 allows wafer 64 to be positioned at a desired position and orientation relative to a projection optical system 46.

Wafer table 51 may be levitated in a z-direction 10b by any number of voice coil motors (not shown), e.g., three voice coil motors. In one described embodiment, at least three magnetic bearings (not shown) couple and move wafer table 51 along a y-axis 10a. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42 is supported by a frame 72. Frame 72 is supported to the ground via isolators 54. Illumination system 42 includes an illumination source, which may provide a beam of EUV light that may be reflected off of a reticle. In one embodiment, illumination system 42 may be arranged to project a radiant energy, e.g., light, through a mask pattern on a reticle 68 that is supported by and scanned using a reticle stage 44 which includes a coarse stage and a fine stage. It should be appreciated that for such an embodiment, photolithography apparatus 40 may be a part of a system other than an EUV lithography system. In general, a stage with isolated actuators may be used as a part of substantially any suitable photolithography apparatus, and is not limited to being used as a part of an EUV lithography system. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optical system 46, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an $F_2$-type laser (157 nm). Alternatively, illumination system 42 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an $F_2$-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolaters such as isolators 54 may generally be associated with an active vibration isolation system (AVIS). An AVIS generally controls vibrations associated with forces 112, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which may include one or more dual force actuators, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 7:
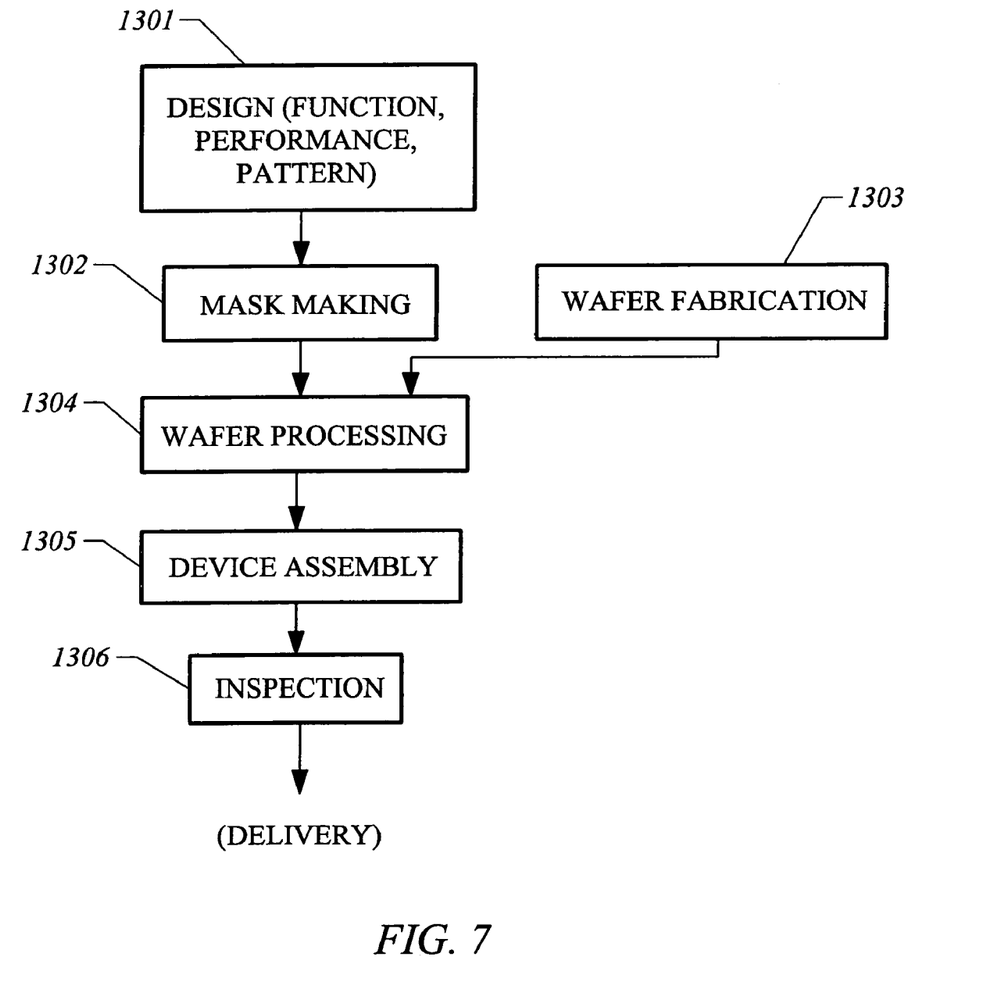
FIG. 7 is a process flow diagram which illustrates the steps associated with fabricating a semiconductor device in accordance with an embodiment of the present invention.

Further, semiconductor devices may be fabricated using systems described above, as will be discussed with reference to FIG. 7. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 8. In step 1305, the semiconductor device is assembled. The assembly of the semiconductor device generally includes, but is not limited to, wafer dicing processes, bonding processes, and packaging processes. Finally, the completed device is inspected in step 1306.

Figure 8:
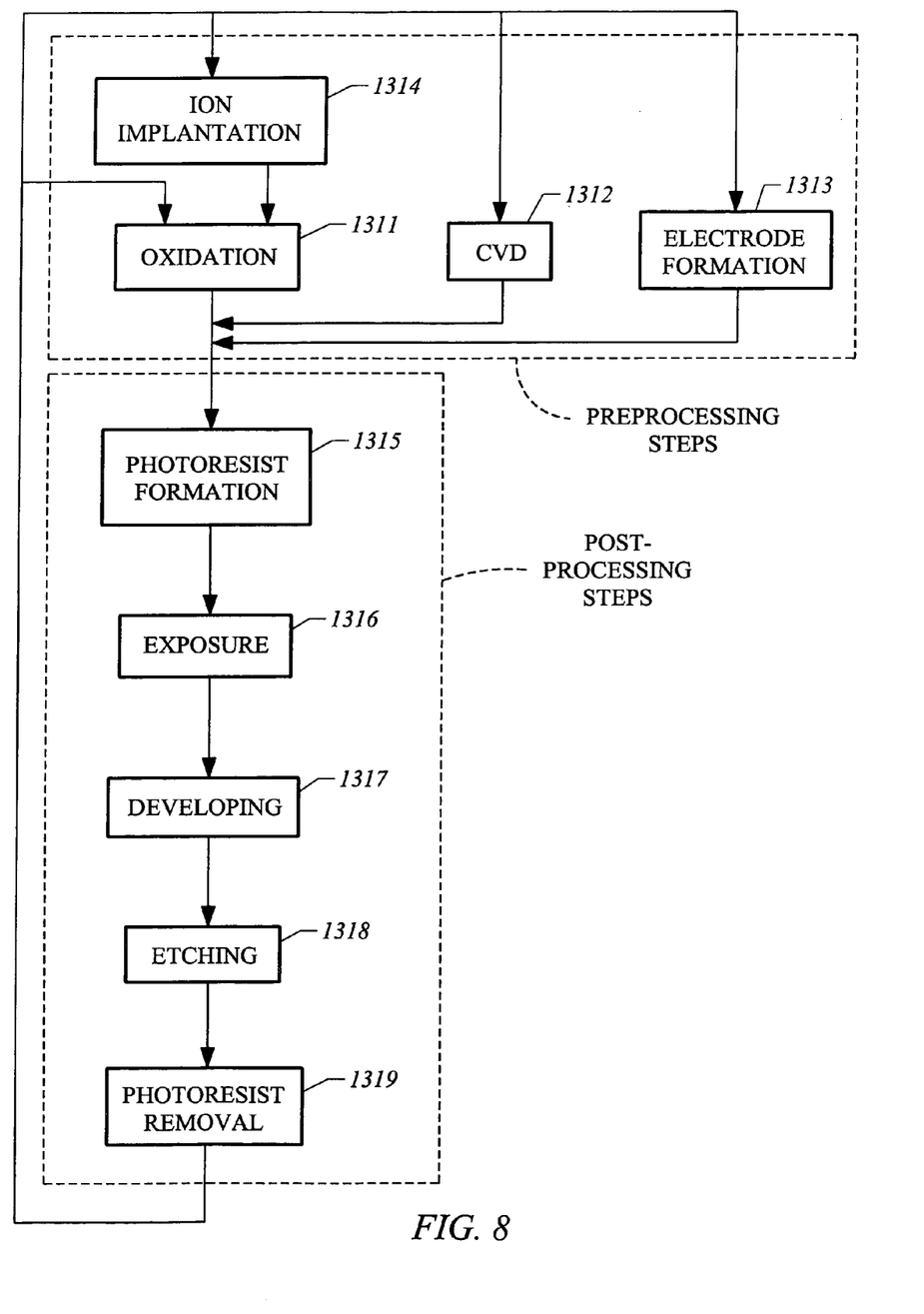
FIG. 8 is a process flow diagram which illustrates the steps associated with processing a wafer, i.e., step 1304 of FIG. 7, in accordance with an embodiment of the present invention.

FIG. 8 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the pre-processing and post-processing steps.

Although only a few embodiments of the present invention have been described, it should be understood that the present invention may be embodied in many other specific forms without departing from the spirit or the scope of the present invention. By way of example, while a vacuum-compatible stage arrangement has been described as being suitable for use as a part of an EUV lithography system, such a stage arrangement may be used for substantially any suitable application, e.g., any suitable application that requires the use of a vacuum. In other words, a stage arrangement as described above is not limited to being used as a part of an EUV lithography system, and may generally be used as a part of a variety of different systems including, but not limited to, systems which operate using a vacuum environment.

The use of a counter mass or a reaction frame as a part of a coarse stage assembly has been described as being suitable for substantially canceling out reaction forces associated with an actuator which drives the coarse stage. In some embodiments, a counter mass may not be used. When a counter mass is not used, then a magnet track associated with the actuator may be mounted to an external wall of a vacuum chamber arrangement without departing from the spirit or the scope of the present invention.

Actuators or motors used with a wafer stage that is operable in a vacuum environment may include substantially any suitable actuators or motors. Suitable actuators or motors include, but are not limited to, motors with moving coils or motors with moving magnets.

In general, a wide variety of fine stages and lithography machines are known to those skilled in the art. It should be appreciated that substantially any suitable fine stages or lithography machines may generally be associated with a wafer stage assembly that is particularly suitable for use in a vacuum environment. That is, the design or configuration of a fine stage or a lithography machine associated with a wafer stage of the present invention may vary widely.

A coarse stage has generally been described as having either three degrees of freedom or a single translational degree of freedom, while a fine stage has been described as having six degrees of freedom. In general, the number of degrees of freedom associated with a coarse stage or a fine stage may vary widely depending upon the requirements of a particular system. Therefore, the present examples are to be considered as illustrative and not restrictive, and the invention is not to be limited to the details given herein, but may be modified within the scope of the appended claims.

What is claimed is:

1. A stage apparatus comprising:
a coarse stage assembly, the coarse stage assembly including a coarse stage and at least one air bearing, wherein the coarse stage is arranged to move in up to three degrees of freedom; and
a fine stage assembly, the fine stage assembly including a fine stage that is arranged substantially adjacent to the coarse stage, the fine stage being arranged to be positioned relative to the coarse stage using electromagnetic energy.

2. A stage apparatus comprising:
a coarse stage assembly, the coarse stage assembly including a coarse stage and at least one air bearing, wherein the air bearing includes at least one pumpout groove arranged to carry a vacuum, the at least one pumpout groove including a first groove, the first groove being arranged to carry the vacuum, a second groove arranged to carry pressurized air, and a third groove arranged to carry a gas at a relatively low pressure that is arranged not to absorb radiation of approximately 13 nanometers; and
a fine stage assembly, the fine stage assembly including a fine stage that is arranged substantially adjacent to the coarse stage, the fine stage being arranged to be positioned relative to the coarse stage using electromagnetic energy.

3. The stage apparatus of claim 2 wherein the gas is one selected from the group consisting of helium, argon, neon, and krypton.

4. An apparatus comprising:
a vacuum chamber arrangement, the vacuum chamber arrangement being arranged to provide a vacuum environment;
a coarse stage assembly, the coarse stage assembly including a coarse stage and at least one air bearing that is vacuum-compatible, wherein the coarse stage is arranged to move in up to three degrees of freedom; and
a fine stage assembly, the fine stage assembly including a fine stage that is arranged substantially adjacent to the coarse stage, the fine stage being arranged to be positioned relative to the coarse stage using electromagnetic energy, wherein the fine stage is arranged to move within the vacuum environment.

5. An apparatus comprising:
a vacuum chamber arrangement, the vacuum chamber arrangement being arranged to provide a vacuum environment;
a coarse stage assembly, the coarse stage assembly including a coarse stage and at least one air bearing that is vacuum-compatible, wherein the vacuum-compatible air bearing includes at least one pumpout groove arranged to carry a vacuum, the at least one pumpout groove including a first groove, the first groove being arranged to carry the vacuum, a second groove arranged to carry pressurized air, and a third groove arranged to carry a gas at a relatively low pressure that is arranged not to absorb radiation of approximately 13 nanometers; and
a fine stage assembly, the fine stage assembly including a fine stage that is arranged substantially adjacent to the coarse stage, the fine stage being arranged to be positioned relative to the coarse stage using electromagnetic energy, wherein the fine stage is arranged to move within the vacuum environment.

6. The apparatus of claim 5 wherein the gas is one selected from the group consisting of helium, argon, neon, and krypton.

7. A stage apparatus suitable for operation in a vacuum environment, the stage apparatus comprising:
a first stage assembly, the first stage assembly including a first stage, at least one vacuum-compatible bearing, and an actuator, the at least one vacuum-compatible bearing and the at least one actuator being arranged to enable the first stage assembly to move along an axis, wherein the at least one vacuum-compatible bearing includes at least one pumpout groove arranged to carry a vacuum, wherein the at least one pumpout groove includes a first groove, the first groove being arranged to carry the vacuum, a second groove arranged to carry pressurized air, and a third groove arranged to carry a gas at a relatively low pressure that is arranged not to absorb radiation of approximately 13 nanometers; and a second stage assembly, the second stage assembly being arranged to support an object to be scanned, the second stage assembly being substantially carried on the first stage assembly such that the second stage assembly is arranged to move with the first stage assembly when the first stage assembly moves, the second stage assembly being arranged to be substantially supported in six degrees of freedom over the first stage assembly by at least one electromagnetic bearing.

8. The stage apparatus of claim 7 wherein the relatively low pressure is a pressure of up to approximately one hundred milliTorr.

9. The stage apparatus of claim 8 wherein the gas is one selected from the group consisting of helium, argon, neon, and krypton.

10. A stage apparatus suitable for operation in a vacuum environment, the stage apparatus comprising:
   a first stage assembly, the first stage assembly including a first stage, at least one vacuum-compatible bearing, and an actuator, the at least one vacuum-compatible bearing and the at least one actuator being arranged to enable the first stage assembly to move along an axis, wherein the at least one vacuum-compatible bearing includes at least one pumpout groove arranged to carry a vacuum; and
   a second stage assembly, the second stage assembly being arranged to support an object to be scanned, the second stage assembly being substantially carried on the first stage assembly such that the second stage assembly is arranged to move with the first stage assembly when the first stage assembly moves, the second stage assembly being arranged to be substantially supported in six degrees of freedom over the first stage assembly by at least one electromagnetic bearing, wherein the first stage is a coarse stage arranged to move with up to three degrees of freedom, and the second stage assembly includes a fine stage.

11. The stage apparatus of claim 10 wherein the first stage assembly includes a guide bar assembly, wherein the coarse stage includes magnets and the guide bar assembly includes coils, the magnets and the coils being arranged to cooperate to enable the coarse stage to move with up to the three degrees of freedom.

12. The stage apparatus of claim 10 wherein the second stage assembly includes a plurality of electromagnetic actuators arranged to enable the fine stage to move in the six degrees of freedom.

13. A stage apparatus suitable for operation in a vacuum environment, the stage apparatus comprising:
   a first stage assembly, the first stage assembly including a first stage, at least one vacuum-compatible bearing, and an actuator, the at least one vacuum-compatible bearing and the at least one actuator being arranged to enable the first stage assembly to move along an axis, wherein the at least one vacuum-compatible bearing includes at least one pumpout groove arranged to carry a vacuum; and
   a second stage assembly, the second stage assembly being arranged to support an object to be scanned, the second stage assembly being substantially carried on the first stage assembly such that the second stage assembly is arranged to move with the first stage assembly when the first stage assembly moves, the second stage assembly being arranged to be substantially supported in six degrees of freedom over the first stage assembly by at least one electromagnetic bearing, wherein the vacuum environment is associated with an extreme ultraviolet lithography system.

14. A stage apparatus comprising:
   a coarse stage assembly, the coarse stage assembly including a coarse stage and at least one air bearing, wherein the air bearing includes at least one pumpout groove arranged to carry a vacuum;
   a fine stage assembly, the fine stage assembly including a fine stage that is arranged substantially adjacent to the coarse stage, the fine stage being arranged to be positioned relative to the coarse stage using electromagnetic energy; and
   a vacuum environment, wherein the coarse stage and the fine stage assembly are arranged to be at least partially positioned in the vacuum environment.

* * * * *